(12) United States Patent
Yow et al.

(10) Patent No.: US 8,643,169 B2
(45) Date of Patent: Feb. 4, 2014

(54) SEMICONDUCTOR SENSOR DEVICE WITH OVER-MOLDED LID

(75) Inventors: Kai Yun Yow, Petaling Jaya (MY); Poh Leng Eu, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 187 days.

(21) Appl. No.: 13/292,104

(22) Filed: Nov. 9, 2011

(65) Prior Publication Data

US 2013/0113054 A1 May 9, 2013

(51) Int. Cl.
  *H01L 23/12* (2006.01)
(52) U.S. Cl.
  USPC .................. 257/704; 257/684; 257/E23.181
(58) Field of Classification Search
  USPC ......... 257/678, 680, 684, 690, 701, 704, 723, 257/E23.18, E23.181, E23.182, E23.193, 257/E23.194
  See application file for complete search history.

(56) References Cited

U.S. PATENT DOCUMENTS

| | | | |
|---|---|---|---|
| 5,581,226 A * | 12/1996 | Shah ............................. | 338/42 |
| 5,877,093 A * | 3/1999 | Heffner et al. ................ | 438/761 |
| 5,912,436 A | 6/1999 | Sanchez | |
| 6,094,356 A | 7/2000 | Fujisawa | |
| 6,266,197 B1 | 7/2001 | Glenn | |
| 6,566,168 B2 | 5/2003 | Gang | |
| 6,707,168 B1 * | 3/2004 | Hoffman et al. ............... | 257/796 |
| 6,781,231 B2 * | 8/2004 | Minervini ...................... | 257/704 |
| 6,900,531 B2 | 5/2005 | Foong | |
| 6,927,482 B1 | 8/2005 | Kim | |
| 7,060,216 B2 | 6/2006 | Schuurmans | |
| 7,462,940 B2 | 12/2008 | Bauer | |
| 7,568,390 B2 | 8/2009 | Shizuno | |
| 7,607,355 B2 * | 10/2009 | Shirasaka et al. ................ | 73/754 |
| 7,705,242 B2 | 4/2010 | Winterhalter | |
| 8,359,927 B2 | 1/2013 | Hooper | |
| 2002/0063326 A1 * | 5/2002 | Nakashima ................... | 257/704 |
| 2004/0014266 A1 | 1/2004 | Uno | |
| 2004/0187977 A1 | 9/2004 | Matsui | |
| 2004/0245320 A1 | 12/2004 | Fukagaya | |
| 2005/0189621 A1 * | 9/2005 | Cheung ......................... | 257/619 |
| 2007/0023873 A1 | 2/2007 | Park | |
| 2007/0298276 A1 | 12/2007 | Teshima | |
| 2008/0050267 A1 | 2/2008 | Murai | |
| 2009/0072399 A1 | 3/2009 | Terashima | |
| 2009/0211784 A1 | 8/2009 | Grogl | |

* cited by examiner

*Primary Examiner* — Laura M Menz
*Assistant Examiner* — Candice Y Chan
(74) *Attorney, Agent, or Firm* — Charles Bergere

(57) ABSTRACT

A packaged semiconductor device with a cavity formed by a cover or lid mounted to a substrate. The lid covers one or more semiconductor sensor dies mounted on the substrate. The dies are coated with a gel or spray on coating, and the lid is encapsulated with a mold compound. A hole or passage may be formed through the cover and mold compound to expose the sensor dies to selected environmental conditions.

6 Claims, 9 Drawing Sheets

126

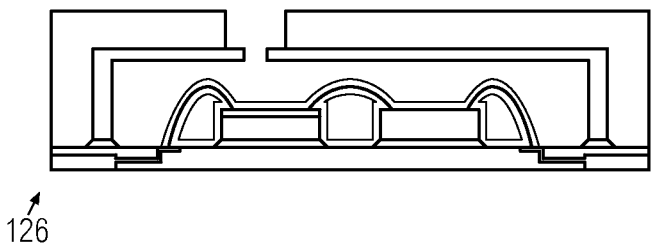
FIG. 16
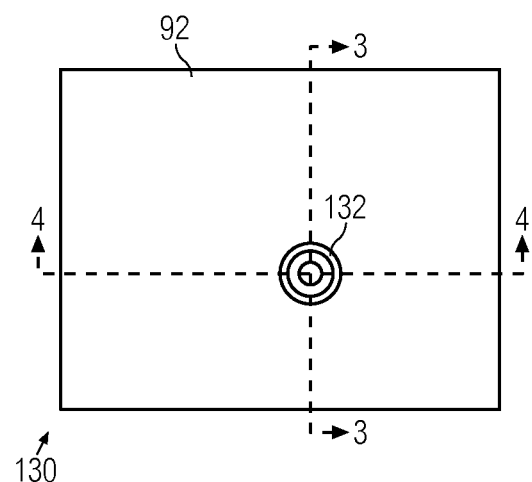
FIG. 17
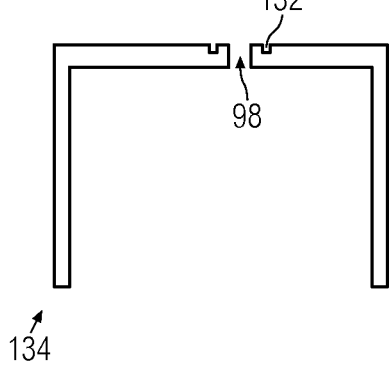     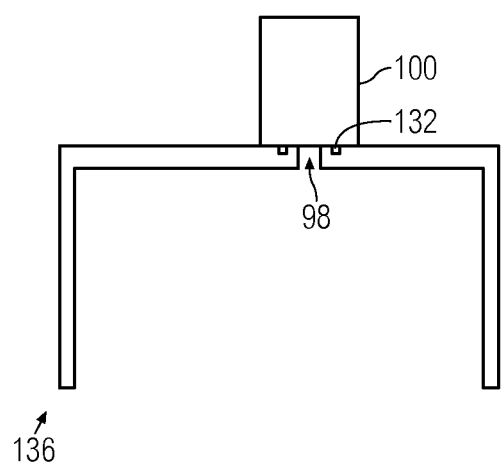
FIG. 18          FIG. 19

US 8,643,169 B2

SEMICONDUCTOR SENSOR DEVICE WITH OVER-MOLDED LID

BACKGROUND OF THE INVENTION

The present invention relates generally to packaging semiconductor integrated circuits, and more particularly to packaging a semiconductor sensor device that has lid and a mold compound formed over the lid.

Semiconductor packages are containers for integrated circuits and devices. The semiconductor package includes an integrated circuit formed on a semiconductor die. The semiconductor die is attached and electrically connected to a lead frame or substrate and then the semiconductor die and electrical connections are covered with a mold compound or encapsulant material to protect the die and the interconnections from moisture, electrical, physical, and other environmental forces and stresses. The I/O connections of the lead frame or substrate are exposed so that the semiconductor die can be connected to external circuitry such as when the semiconductor package is mounted to a printed circuit board (PCB).

Some semiconductor devices have a cavity formed within the packaged semiconductor assembly. For example, some semiconductor sensor devices require a cavity within the assembly for the functionality of the specific dies, such as sensor dies, like pressure sensor dies, g-cell or acceleration transducer dies, parameterized cell (p-cell) dies, temperature sensor dies, piezo resistive transducer (PRT) dies, optical sensor dies, light emitting/receiving dies, etc. For example, pressure sensor devices are not fully encapsulated to allow exposure to ambient environmental pressure conditions; however, the package must still protect the die from exposure to other environmental stresses and conditions.

Assembling such cavity package devices typically includes forming a cavity with a pre-molded lead frame and a lid attached to the lead frame, where a sensor die is mounted on the lead frame within the cavity and a gel is coated on the die prior to attachment of the lid to the lead frame. In such devices using pre-molded lead frames, where the cavity is formed by the mold itself, there is a possibility of gel leakage through micro-gaps that exist between the mold and the leads. This leakage of the gel can contribute to device defects and low production yields. Accordingly, such pre-molded cavity lead frames lack robustness.

Further, pre-molded lead frames are relatively expensive, adding to the cost of the packaged device. Also, sensor dies may experience parametric shifts during extreme environmental conditions imposed on the devices during processing and testing, for example by rapid decompression event (RDE) testing, where the packaged devices undergo rapid pressure drops to insure there is no bubble formation near the sensors, interfaces, and substrate.

Thus, there is a need for a cavity-type semiconductor device that addresses or at least alleviates some or all of the above problems.

BRIEF DESCRIPTION OF THE DRAWINGS

The accompanying drawings incorporated herein and forming a part of the specification illustrate several aspects of the present invention and, together with the description, serve to explain the principles of the invention. While the invention will be described in connection with certain embodiments, there is no intent to limit the invention to those embodiments described. On the contrary, the intent is to cover all alternatives, modifications and equivalents as included within the scope of the invention as defined by the appended claims. In the drawings:

FIG. 16 is a cross-sectional view of a cavity-type sensor device in accordance with an embodiment of the invention;

FIG. 17 is a top plan view of a cover in accordance of an embodiment of the invention;

FIG. 18 is a cross-sectional view of the cover taken along line 3-3 of FIG. 17 in accordance with an embodiment of the invention;

FIG. 19 is a cross-sectional view of the cover taken along line 4-4 of FIG. 17 in accordance with an embodiment of the invention;

DETAILED DESCRIPTION

An aspect of the invention is a method of packaging a cavity package semiconductor assembly, comprising providing a substrate with a lead; mounting an integrated circuit device on the substrate; connecting the integrated circuit device to the lead of the substrate; mounting a cover to the substrate to cover the integrated circuit device and form a cavity between the substrate surface and the cover; and disposing a mold material layer over the cover.

In an embodiment, a hole is formed through the mold material layer and the cover. The hole may be covered with a cap during molding. A mold material or resin bleed control may be formed in the surface of the cover and/or the surface of the cap proximate the hole. The cap may be released or removed after disposing the mold material layer over the cover.

In an embodiment, the integrated circuit device is coated with a coating material before mounting the cover to the substrate to cover the integrated circuit device. The substrate may be masked before coating the integrated circuit device with the coating material. The integrated circuit device may be coated with a coating material after mounting the cover to the substrate, or the integrated circuit device may be coated with a coating material before or after disposing the mold material layer over the cover. In an embodiment, the surface of the cover is treated before disposing the mold material layer over the cover.

An aspect of the invention is a cavity package semiconductor assembly comprising of a substrate with a lead; an integrated circuit device mounted on the substrate; an interconnector for electrically connecting the integrated circuit device to the lead of the substrate; a cover mounted to the substrate to cover the integrated circuit device and form a cavity between the substrate surface and the cover; and a mold material layer formed over the surface of the cover.

In an embodiment, a hole is formed through the mold material and the cover. A mold or resin bleed control may be formed in the surface of the cover and/or the surface of the cap proximate the hole. The mold bleed control may be a groove and/or a bump. In an embodiment, the integrated circuit device is coated over with a coating within the cavity. The coating may be a spray coating or a gel coating. In an embodiment, at least two integrated circuit devices are mounted to the substrate under the cover. The assembly and/or the cover may have at least two holes, each hole having a corresponding mold bleed control. The hole may be formed on the top surface and/or the side surface of the cover.

Figure 1:
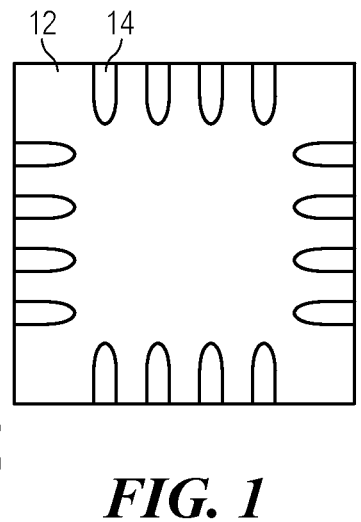
FIG. 1 is a bottom plan view of a substrate in accordance with an embodiment of the present invention.
Figure 2:
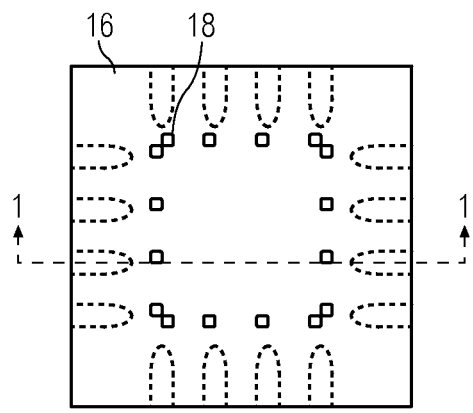
FIG. 2 is a top plan view of the substrate of FIG. 1.
Figure 3:
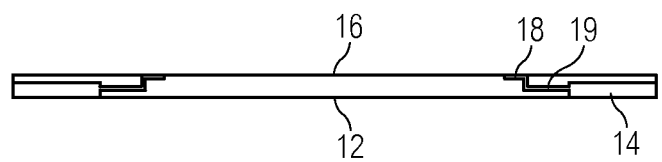
FIG. 3 is a cross-sectional view of the substrate of FIG. 2 taken along line 1-1.
Figure 5:
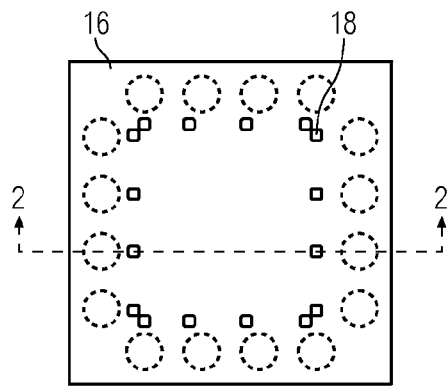
FIG. 5 is a top plan view of the substrate of FIG. 4.
Figure 6:
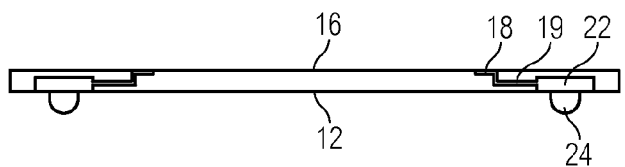
FIG. 6 is a cross-sectional view of the substrate of FIG. 5 taken along line 2-2.

FIGS. 1 to 15 show different stages of packaging one or more semiconductor dies in accordance with an embodiment of the invention. FIGS. 1-3 show a substrate for a land grid array (LGA) type semiconductor package, while FIGS. 4-6 show a substrate for a ball grid array (BGA) type semiconductor package in accordance with embodiments of the invention.

Referring now to FIG. 1, a bottom plan view of a substrate 10 for a LGA type semiconductor package is shown in accordance with an embodiment of the invention. The substrate 10 is a planar substrate typically used in the industry having a first side 12 or bottom surface and leads 14, solder pads or the like. FIG. 2 is a top plan view of the substrate 10 of FIG. 1. The substrate 10 has a second side 16 or top surface, and bond pads 18. The leads 14 (shown in FIG. 1) are shown with dashed lines in FIG. 2.

FIG. 3 is a cross-sectional view of the substrate 10 of FIG. 2 taken along line 1-1 in accordance with an embodiment of the invention. An interconnector 19 or via connector is shown for electrically connecting the leads 14 on the bottom surface 12 with the bond pads 18 of the top surface 16.

Figure 4:
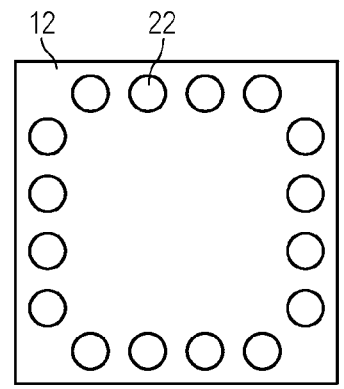
FIG. 4 is a bottom plan view of a substrate in accordance with an embodiment of the invention.

Referring to FIG. 4, a bottom plan view of a substrate 20 is shown, which is similar to the substrate 10 shown in FIGS. 1-3, but arranged for a BGA type package in accordance with an embodiment of the invention. The substrate 20, as is the substrate 10, the same as those typically used in the industry such, and has a bottom or first side 12, and leads 22, bond or solder pads or the like. FIG. 5 is a top plan view of the substrate 20 of FIG. 4. The substrate 20 has a top surface or second side 16, and bond pads 18. The leads 22 (shown in FIG. 4) are shown with dashed lines in FIG. 5.

FIG. 6 is a cross-sectional view of the substrate 20 of FIG. 5 taken along line 2-2 in accordance with an embodiment of the invention. An interconnector 19 or via connector is shown for electrically connecting solder balls 24, spheres, bumps or the like, leads 22 on the bottom surface 12 with the bond pads 18 of the top surface 16.

The substrate 10, 20 may be any material such as silicon (Si), silicon dioxide ($SiO_2$), gallium arsenide (GaAs) and the like to support and electrically interconnect the integrated circuits formed thereon and may form a printed circuit board (PCB) or the like. The leads 14, bond pads 18 and interconnections or vias 19 may be any electrically conducting material such as copper (Cu) or the like. It is noted that using a substrate with vias connecting the leads 14 to the pads 18 will prevent leakage of coating material, discussed below, from seeping through the substrate as is possible when using a pre-molded lead frame.

Figure 7:
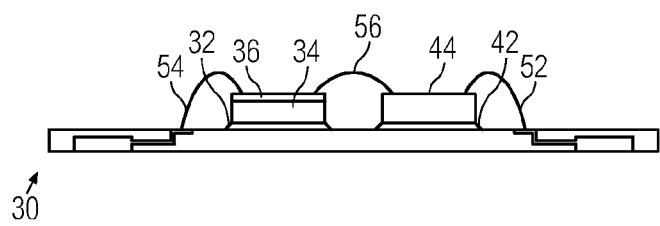
FIG. 7 is a cross-sectional view of the substrate of FIG. 3 with p-cell and g-cell sensor devices mounted thereon in accordance with an embodiment of the invention.

FIG. 7 is a cross-sectional view of an assembly 30 including the substrate 10 of FIG. 3 with one or more semiconductor dies mounted on and attached to the second side 16 of the substrate 10. Although the processing discussed herein is applied to the LGA type substrate 10 shown in FIGS. 1-3, it will be appreciated that the processing may be applied to the BGA type of substrate 20 shown in FIGS. 4-6 and other types of substrates not shown. The assembly 30 in this embodiment will form a pressure sensor device. The assembly 30 has a first die attach material 32 such as epoxy, die bond layer or the like applied to the substrate 10 to mount and attach a first die 34 on the second side 16 thereof. In this embodiment the first die 34 is semiconductor sensor die such as a pressure cell (p-cell) having a pressure membrane 36 or the like. A second die attach material 42, such as epoxy, die bond layer or the like is applied to the second side 16 of the substrate 10 adjacent to the first die 34 to mount and attach a second die 44. In this embodiment the second die 44 is a g-cell. However, the second die 44 could be an integrated circuit such as an ASIC. Bond wires 52, 54 and 56 illustrate connections between the substrate bond pads 18, the first semiconductor die 34 and the second semiconductor die 44. The bond wires 52, 54, 56 may be connected using standard wire bonding equipment and the wires themselves may comprise currently known bond wires such as those formed of gold (Au), copper (Cu), aluminium (Al), or the like, and the wires may be bonded in any order. It will be appreciated that other types and any number of integrated circuits and dies may be mounted on the substrate, and the devices and dies shown here are for illustrative purpose only.

Figure 8:
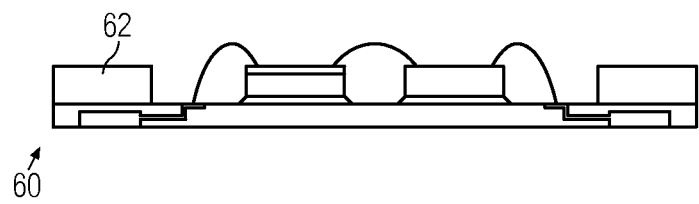
FIG. 8 is a cross-sectional view of the assembly of FIG. 7 with a mask layer covering bond pads in accordance with an embodiment of the invention.

FIG. 8 is a cross-sectional view of an assembly 60 comprising the assembly 30 of FIG. 7 with a mask or mask layer 62 that covers a portion of the second side 16 of the substrate 10 in accordance with an embodiment of the invention. The covered or masked portion of the second side 16 is where a lid is to be attached to the second side 16 of the substrate 10, as discussed below with reference to FIG. 12.

Figure 9:
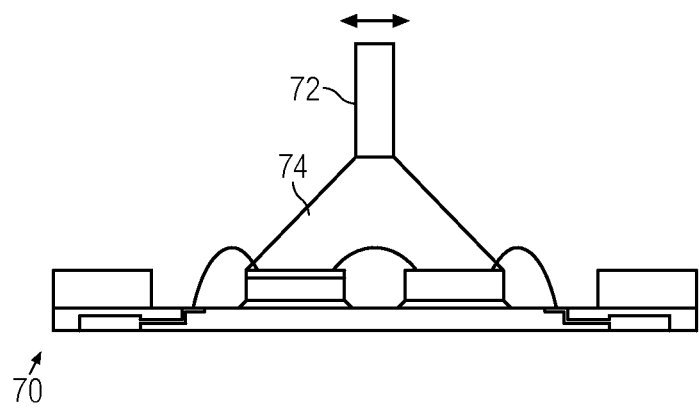
FIG. 9 is a cross-sectional view of the assembly of FIG. 8 with a means for applying a coating to the semiconductor dies in accordance with an embodiment of the invention.

FIG. 9 is a cross-sectional view of the assembly 60 of FIG. 8 that illustrates a step of coating the dies 34, 44 and wires 52, 54, 56 with a coating material 74. In this embodiment, the coating material 74 is a conformal material applied with a sprayer 72. The conformal coating provides dielectric insulation, protection against moisture, dust and other contaminants, and improves resistance to thermal shock, vibration and the like. The conformal coating should be applied such there is a good film build-up on all surfaces, applied relatively evenly, and be free of micro-holes. The conformal coating may be applied by brushing, dipping, vacuum deposition, or in this case, by spraying.

Figure 10:
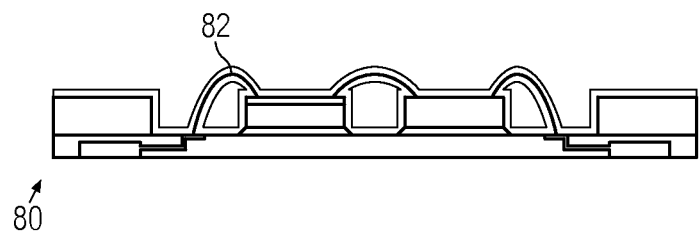
FIG. 10 is a cross-sectional view of the assembly of FIG. 9 with a coating applied in accordance with an embodiment of the invention.
Figure 11:
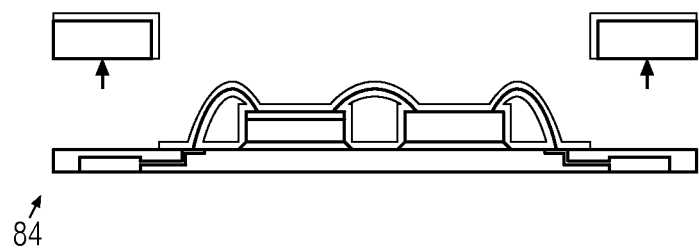
FIG. 11 is a cross-sectional view of the assembly of FIG. 10 with the mask layer removed in accordance with an embodiment of the invention.

FIG. 10 is a cross-sectional view 80 illustrating a coating layer 82 formed over the surface of the substrate 10, dies 34, 44, wires 52, 54, 56, and the mask layer 62. The coating material may be a Parylene coating or the like with proven stress data. The coating layer 82 may have a thickness of approximately in the range of 0.1 mils (2.54 µm) to 0.2 mils (5.08 µm); however the coating layer 82 may have different thicknesses for different applications and embodiments. It will be appreciated that in the embodiment shown in FIGS. 9-15, the coating layer 82 has some advantages over the use of gel, as the application of the spray coating layer is accurate and bleeding is not an issue. FIG. 11 is a cross-sectional view of the substrate 10 of FIG. 10 showing a step 82 of removing the mask layer 62. As can be seen, the mask layer 62 prevented predefined areas of the substrate 20 from being covered with the coating material 82.

Figure 12:
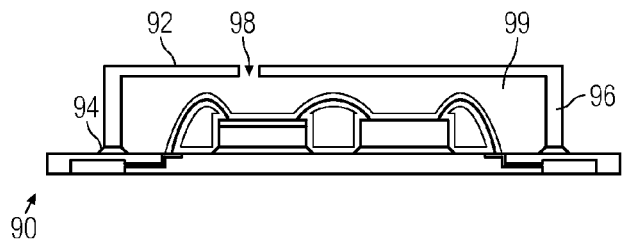
FIG. 12 is a cross-sectional view of the assembly of FIG. 11 with a cover or lid mounted on the substrate in accordance with an embodiment of the invention.

FIG. 12 is a cross-sectional view showing an assembly 90 including the coated substrate 20 of FIG. 11, but now a cover or lid 92 is mounted to the substrate 10 at the predefined areas of the substrate 10 that were protected from being covered with the coating material 82 by the mask 62. The lid 92 may be any suitable material such as metal or plastic, but according to an embodiment of the invention, it is preferred to use a high-temperature plastic material for the lid 92. Such plastic materials suitable for the lid 92 include for example, polyetheretherketone (PEEK), polyetherketone (PEK), and the like. PEEK and PEK are semi-crystalline thermoplastic and polyimides, other materials may be used that are suitable for a particular application or embodiment. The lid 92 has a generally planar first surface and two side surfaces 96 that extend generally perpendicularly away from the first surface. Distal ends of the side surfaces 96 are attached to the second surface 16 of the substrate 10. More particularly, an adhesive material 94 is applied on the top surface 16 of the substrate 10 in the areas protected by the mask 62 and the lid 92 is then "glued" into place. As used herein, the term glued means attached using an adhesive.

The lid 92 together with the substrate 10 forms a chamber or cavity 99 in which the dies 34, 44 reside. In this embodiment, the lid 92 has a top exterior surface and side exterior surface of sides 96, and an interior surface, where the interior top surface and interior side surfaces form the cavity 99. It will be appreciated that the interior surface of the lid forming the cavity may take different forms, such as a single curved surface, a top interior surface with side interior surface, additional interior surfaces, or the like. In this embodiment, the lid 92 has an aperture, passageway, or hole 98 formed in the top surface. The hole 98 allows the sensor dies 34, 44 to function by exposing the sensor dies 34, 44 to the desired environmental condition(s) that the sensors thereof are designed to detect.

It will be appreciated that the hole 98 may be formed in the top surface of the lid 92 as shown, or at other surfaces such as for example the side 96 surface of the lid 92.

Figure 13:
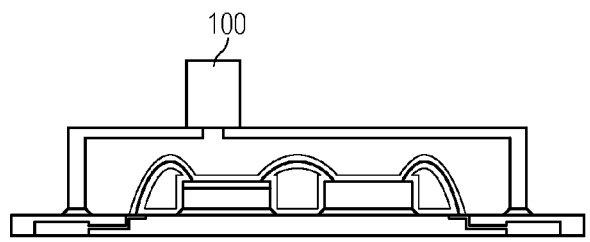
FIG. 13 is a cross-sectional view of the assembly of FIG. 12 with a cap to cover a bore hole in the cover shown in FIG. 12 in accordance with an embodiment of the invention.

FIG. 13 follows from FIG. 12 and illustrates a step of disposing a plug or cap 100 in the hole 98. The cap 100 is placed or pressed into the hole 98 to prevent mold material from entering the cavity 99.

Figure 14:
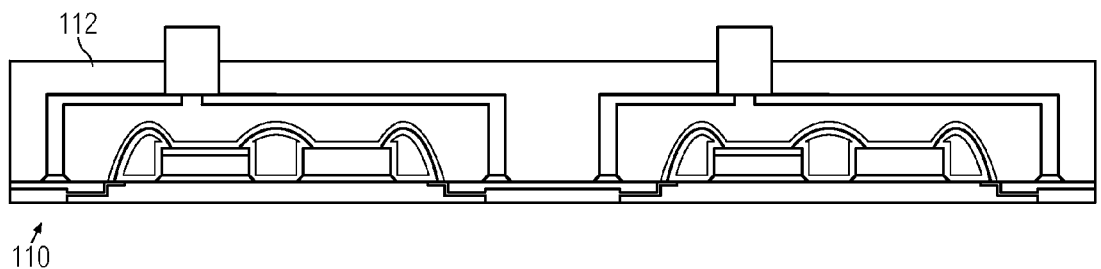
FIG. 14 is a cross-sectional view of a the assembly of FIG. 13 after encapsulation with a molding compound in accordance with an embodiment of the invention.
Figure 15:
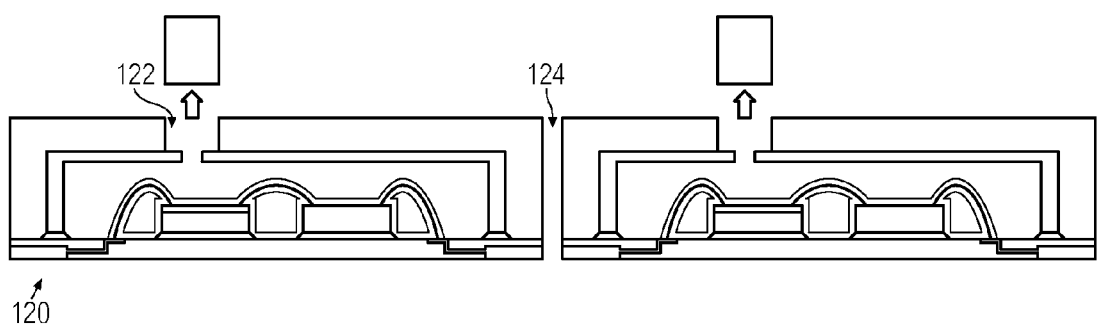
FIG. 15 illustrates the step of singulating the assembly of FIG. 14 in accordance with an embodiment of the invention.

FIG. 14 follows from FIG. 12 and illustrates a step 110 of covering or encapsulating the substrate 10 and lid 92 with a mold compound or encapsulating material such that the device(s) being formed have an encapsulating material layer 112. As noted above, the cap 100 prevents the encapsulating material 112 from entering the cavity 99. Preferably the cap 100 extends outwardly from the encapsulating material layer 112 so that it may be removed later (FIG. 15). In one embodiment of the invention, the top or outer surface of the lid 92 is treated, such as roughened or the like, prior to encapsulation to enhance adherence of the encapsulating material 112. FIG. 14 also shows that multiple devices may be assembled simultaneously. That is, the substrate 10 could be a strip having a line of areas for forming sensor devices or the substrate 10 could be formed such that an array of devices is formed simultaneously. Such batch processing is known in the art and therefore a detailed discussion is not necessary for a complete understanding of the present invention.

FIG. 15 illustrates a step 120 of removing the cap(s) 100 and separating adjacent devices with a singulating operation. Removing the cap 100 results in a gap 122 over the hole 98 in the encapsulating material layer 112 that is aligned with the hole 98 in the lid 92. The multiple devices are separated by a singulation process such as sawing or the like along separation line 124 between the devices. FIG. 16 is a cross-sectional view of a sensor device 126 formed in accordance with the above-described steps in accordance with an embodiment of the invention.

FIG. 17 is a top plan view 130 of a cover or lid 92 in accordance with an embodiment of the invention. Although the lid 92 is shown with a rectangular, planar shape with sides at right angles from the top surface, it will be appreciated that the top surface may take other shapes and forms other than rectangular and planar, such as square, circular, or the like. Also, the sides may form different angles with respect to the top surface and the substrate surface other than at right angles, and the sides and top surface may form continues side. For illustrative purposes only, example dimensions of the lid 92 are approximately 4-5 mm square for the top surface, 1-1.5 mm high for the sides, and having a thickness of 0.3-0.6 mm. Of course, the dimensions of the cover may be different within or outside of the example ranges given here, for any specific application or embodiment. The lid 92 includes the hole 98 (FIGS. 18-19). The hole 98, like the lid 92, may take different shapes and forms other than circular, such as square, rectangular, or the like The lid 92 may be formed by any suitable process such as by injection molding or the like. In an injection molding process the hole 98 can be created for example with a pin injected in the mold cavity, or the like. Alternatively, the hole 98 may be formed by drilling, punching, or the like.

The lid 92, in one embodiment, also includes a mold resin bleed control 132 that preferably is proximate to the hole 98. In this embodiment, the mold resin bleed control 132 is in the form of a groove, trench, or the like. In this embodiment the groove is a circular groove and works in conjunction with the cap 100 (FIG. 13). The purpose of the resin bleed control 132 is to arrest any excess mold or mold bleed from the outer circumference of the cap 100. It will be appreciated that the mold resin bleed control 132 may take different shapes and designs other than circular. For example, the mold resin bleed control 132 may form a series of grooves or bumps or the like. It will be appreciated that the mold resin bleed control 132 also may be formed in the cap 100 instead of, or in conjunction of the cover 92.

FIG. 18 is a cross-sectional view 134 of the lid 92 taken along line 3-3 of FIG. 17, and FIG. 19 is a cross-sectional view 136 of the lid 92 taken along line 4-4 of FIG. 17 and shows the cap 100 disposed over the hole 98. It should be noted that the cap 100 extends over the resin bleed control 132. While in this embodiment the hole 98 is formed in the top surface of the lid 92, it will be appreciated that the hole 98 and corresponding mold resin bleed control 132 may be formed anywhere along the surface of the lid 92. It will also be appreciated that any number of holes and mold or resin bleed controls may be formed in the cover 92. Also, although the cap 100 is shown as not extending into the hole 98, the cap 100 could include a protrusion that extends into the hole 98.

Figure 20:
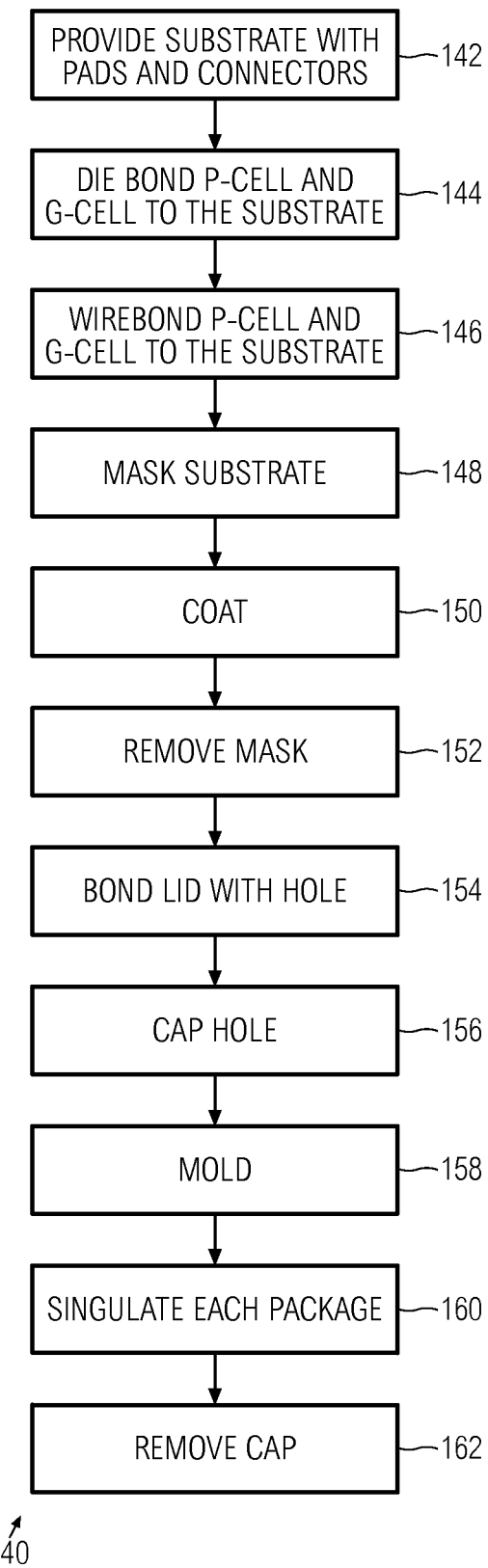
FIG. 20 is a flow chart of a method of assembling or packaging a semiconductor sensor device in accordance with an embodiment of the invention.

FIG. 20 is a flow chart of a method 140 of packaging at least one semiconductor sensor die in accordance with an embodiment of the invention. The substrate is provided at 142 with pads, leads, vias and the like as previously described. One or more sensor dies are die bonded at 144 on the top surface of the substrate. At 146, the sensor dies are connected with bond wires with a wire bonding process to each other and to the bond pads on the substrate. At 148, a mask is disposed over the substrate, and at 150 a coating material is disposed on the masked substrate, dies and bond wires. After coating, at 152, the mask is removed. At 154, the lid or cover, which in one embodiment includes a hole, is bonded or attached on the substrate 152, and the cover is bonded or mounted. At 156, a cap is placed over the hole to prevent resin from entering the cavity. At step 158 a molding process is conducted in which an encapsulant or mold material is formed over the lid and in some embodiments also over exposed portions of the top surface of the substrate. At 160, adjacent devices are separated from each other via a singulation process such as when an array of devices is assembled simultaneously. Finally, at step 162, the cap is removed. While it is preferred that the cap is removed after singulation because it prevents dust created during singulation from entering the cavity, it is possible to remove the cap prior to the singulation process.

Figure 21:
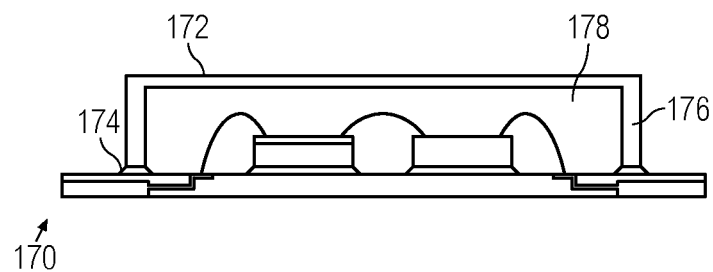
FIG. 21 is a cross-sectional view of the assembly of FIG. 7 with a cover in accordance with an embodiment of the invention.
Figure 22:
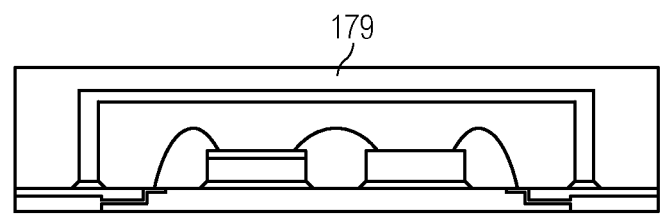
FIG. 22 is a cross-sectional view of the device of FIG. 21 encapsulated in accordance with an embodiment of the invention.
Figure 23:
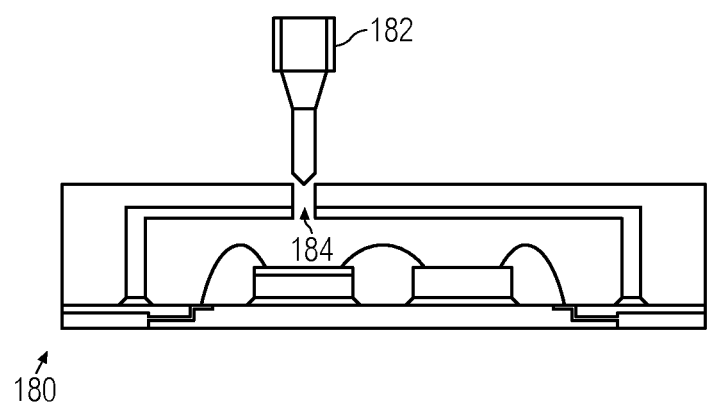
FIG. 23 is a cross-sectional view of the encapsulated device of FIG. 22 with a hole being formed in the cover in accordance with an embodiment of the invention.

FIGS. 21-25 are cross-sectional views illustrating a process of forming a hole in a lid of a sensor device and covering the sensor die(s) with a coating material. Referring now to FIG. 21, a cross-sectional view 170 of a packaged sensor device with a cover 172 is shown. The cover 172 has sides 176 that have a distal end or surface that is attached or bonded to the substrate with an adhesive 174. A cavity 178 is formed beneath the lid 172. FIG. 22 shows the sensor device with lid after encapsulation, with a layer 179 of encapsulation material, e.g., mold compound. Unlike the lid 92 (FIGS. 12-19), the lid 172 does not have a pre-formed hole or passageway. Instead, in this embodiment, a hole is formed in the lid 172 after encapsulation. FIG. 23 is a cross-sectional view 180 of the encapsulated sensor device of FIG. 22 with a drill or hole boring machine 182 forming a hole 184 in the top surface of the lid 172. The hole 184, after formation, extends from one side of the lid 172 to the cavity 178. The bore machine 182 may be a high-precision drill or the like to form the hole 184. It will be appreciated that the hole may be formed in the top surface of the assembly as shown, or at other surfaces such as for example the side surface of the assembly.

Figure 24:
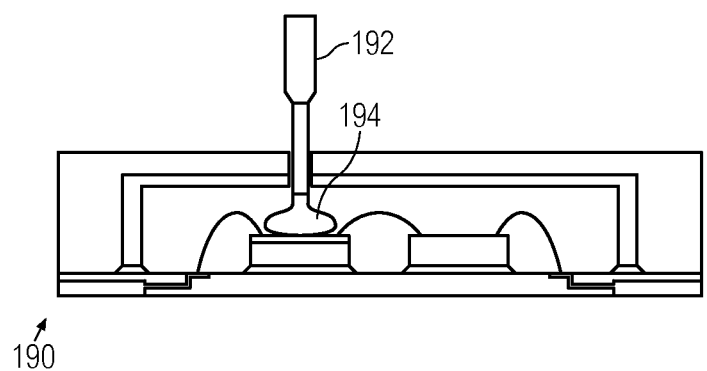
FIG. 24 is a cross-sectional view of the sensor device of FIG. 23 with a gel depositor depositing gel onto the dies of the device in accordance with an embodiment of the invention.
Figure 25:
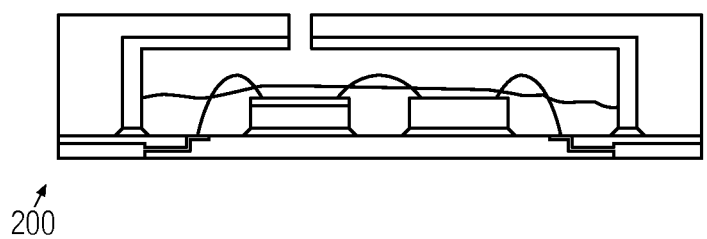
FIG. 25 is a cross-sectional view of the sensor device of FIG. 24 with gel deposited on the dies in accordance with an embodiment of the invention.

FIG. 24 is a cross-sectional view 190 showing a gel depositor 192, which may be a syringe or the like depositing gel material 194 onto the dies and wires disposed within the cavity 178. The syringe 192 is inserted into the cavity 178 by way of the hole 184. A predetermined amount of gel material is deposited over the dies and bond wires using time-pressure, air over dispensing technology, or the like. Such time-pressure dispensing systems are known in the industry, such as the Musashi system supplied by Musashi Engineering, Inc. of Tokyo, Japan. Gel material 194 may be any suitable material as typically used in the industry. For example, such gel materials include: the SIFEL8000 series supplied by Shin-Etsu Chemical Co., Ltd. of Tokyo, Japan; or DC 4939 supplied by the Dow Corning Corporation of Midland, Mich., United States of America. The gel material 194 protects the wires and dies from thermal and mechanical stresses and shocks while allowing the dies to function as sensors, such as pressure sensors, or the like. FIG. 25 is a cross-sectional view 200 of the sensor device of FIG. 24 after the gel material 194 has been deposited on the dies and bond wires.

Figure 26:
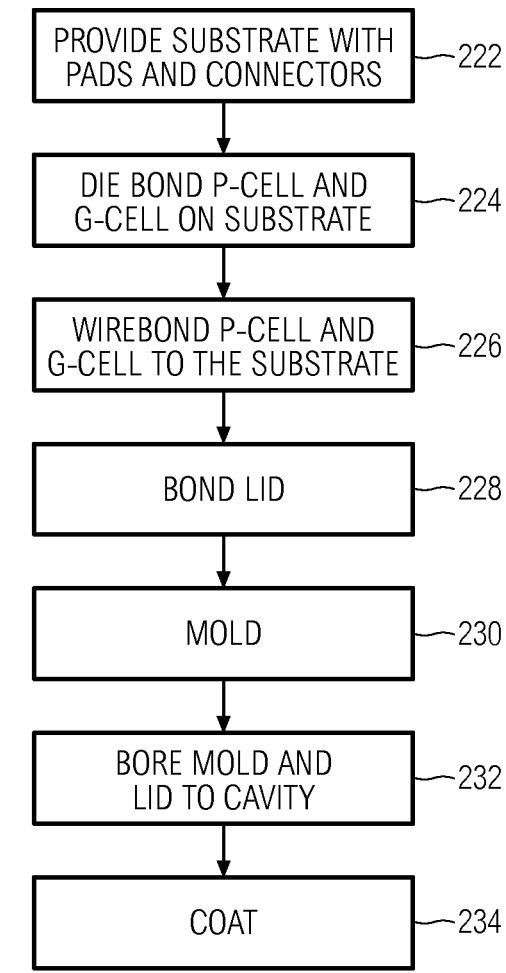
FIG. 26 is a flow chart of a method of assembling or packaging a sensor device in accordance with an embodiment of the invention.

FIG. 26 is a flow chart of a method 220 in accordance with an embodiment of the invention. At 222, the substrate is provided with bond pads, leads, and vias. At 224, the dies are attached to the top surface of the substrate. At 226, wires are wire bonded to electrically connect the dies to the substrate and in some embodiments to each other. At 228, a lid is bonded or mounted to the substrate surface. At 230 an encapsulant or mold material is formed over the lid. At 232 a hole is drilled or bored 232 through the encapsulant material layer and the cover. At 234, the dies and wires within the cavity are coated 234 with a gel coating.

Embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

What is claimed is:

1. A semiconductor sensor device, comprising:
    a substrate having a first surface with a bond pad on the first surface;
    at least one semiconductor sensor die attached to a first side of the substrate;
    a bond wire for electrically connecting the sensor die to the bond pad;
    a lid mounted to the substrate that covers the sensor die, wherein a cavity is formed between the substrate first surface and the lid;
    a mold material layer formed over an outer surface of the lid, wherein the mold material layer includes an opening that is aligned with an opening in the lid, said openings at least partially exposing the sensor die to the external environment; and
    a mold bleed control mechanism in the surface of the lid proximate to the hold in the lid.

2. The semiconductor sensor device of claim 1, wherein the mold bleed control mechanism is a groove.

3. The semiconductor sensor device of claim 1, further comprising a coating over the sensor die within the cavity.

4. The semiconductor sensor device of claim 3, wherein the coating is a spray coating.

5. The semiconductor sensor device of claim 3, wherein the coating is a gel coating.

6. The semiconductor sensor device of claim 1, further comprising at least two semiconductor dies mounted to the substrate first surface and covered by the lid.

\* \* \* \* \*